(12) United States Patent
Chung et al.

(10) Patent No.: US 9,690,345 B2
(45) Date of Patent: *Jun. 27, 2017

(54) POWER CONSUMPTION CONTROL IN COMPUTER SYSTEM

(71) Applicant: International Business Machines Corporation, Armonk, NY (US)

(72) Inventors: Yao-Huan Chung, Taipei (TW); Ko-Chen Tan, New Taipei (TW); Chun Hung Yu, Taipei (TW); Yu Yu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/730,569

(22) Filed: Jun. 4, 2015

(65) Prior Publication Data

US 2015/0268708 A1 Sep. 24, 2015

Related U.S. Application Data

(63) Continuation of application No. 14/547,923, filed on Nov. 19, 2014.

(30) Foreign Application Priority Data

Nov. 29, 2013 (TW) .............................. 102143783 A

(51) Int. Cl.
*G06F 1/32* (2006.01)
*G06F 11/30* (2006.01)
(Continued)

(52) U.S. Cl.
CPC ................ *G06F 1/266* (2013.01); *G06F 1/26* (2013.01); *G06F 1/28* (2013.01); *G06F 1/32* (2013.01);
(Continued)

(58) Field of Classification Search
None
See application file for complete search history.

(56) References Cited

U.S. PATENT DOCUMENTS 7,441,133 B2 10/2008 Giat et al.
7,827,421 B2 11/2010 Brewer et al.
(Continued)

FOREIGN PATENT DOCUMENTS

CN 102122137 A 7/2011
CN 102478954 A 5/2012
(Continued)

OTHER PUBLICATIONS

Machine translation of TW 201427219 to Ku et al.*
(Continued)

*Primary Examiner* — Tanh Nguyen
(74) *Attorney, Agent, or Firm* — Jay Wahlquist

(57) ABSTRACT

A rack-style computer system is provided. The computer system includes a first server, a second server, and a power distribution unit (PDU). The PDU supplies power to the first server and the second server and monitors the power supplied to the first server and the second server and obtains a power sum value. The first server determines whether the power sum value exceeds a predetermined threshold, and if the determination is affirmative, the first server performs a power throttling.

3 Claims, 3 Drawing Sheets

(51) Int. Cl.
*G06F 1/26* (2006.01)
*G06F 1/28* (2006.01)
*H05K 7/14* (2006.01)

(52) U.S. Cl.
CPC ............ *G06F 1/324* (2013.01); *G06F 1/3206* (2013.01); *G06F 1/3234* (2013.01); *G06F 1/3237* (2013.01); *G06F 1/3243* (2013.01); *G06F 1/3246* (2013.01); *G06F 1/3296* (2013.01); *H05K 7/1492* (2013.01); *H05K 7/1498* (2013.01); *Y02B 60/1217* (2013.01); *Y02B 60/1285* (2013.01)

(56) References Cited

U.S. PATENT DOCUMENTS

| | | | |
|---|---|---|---|
| 7,984,311 | B2 | 7/2011 | Brumley et al. |
| 2009/0132842 | A1* | 5/2009 | Brey ............... G06F 1/3203 713/322 |
| 2009/0322150 | A1* | 12/2009 | Cline ............... G06F 1/206 307/35 |
| 2011/0144818 | A1 | 6/2011 | Li et al. |
| 2012/0078429 | A1 | 3/2012 | Weston et al. |
| 2012/0116590 | A1 | 5/2012 | Florez-Larrahondo et al. |
| 2012/0131394 | A1 | 5/2012 | Hsu |
| 2013/0318371 | A1* | 11/2013 | Hormuth ............ G06F 1/28 713/320 |
| 2014/0115357 | A1* | 4/2014 | Li .................. G06F 1/3206 713/320 |
| 2015/0268708 | A1* | 9/2015 | Chung ............... G06F 1/3296 713/330 |

FOREIGN PATENT DOCUMENTS

| | | | | |
|---|---|---|---|---|
| TW | 201017370 A | | 5/2010 | |
| TW | 201329690 A | | 7/2013 | |
| TW | 201427219 A | * | 7/2014 | ............... G06F 1/26 |

OTHER PUBLICATIONS

Chung, et al., "Power Consumption Control in Computer System", U.S. Appl. No. 14/547,923, filed Nov. 19, 2014.

List of IBM Patents or Patent Applications Treated as Related.

TW Application 102143783, entitled "Power Consumption Control in Computer System," filed Nov. 29, 2013.

Unknown, "Ten Steps to Increasing Data Center Efficiency and Availability through Infrastructure Monitoring," Emerson Network Power, A White Paper from the Experts in the Business-Critical Continuity. 16 pages. Printed in USA. © 2010 Liebert Corporation.

Unknown, "Method and system for using AC frequency to convey PDU information", IP.com Disclosure No. IPCOM000222809D. Publication Date: Oct. 23, 2012. 3 pages. https://priorartip.com/IPCOM/000222809.

Wang, X., et al., "SHIP: Scalable Hierarchical Power Control for Large-Scale Data Centers," 2009 18th International Conference on Parallel Architectures and Compilation Techniques. 2009 IEEE. pp. 91-100. DOI 10.1109/PACT.2009.34.

* cited by examiner

POWER CONSUMPTION CONTROL IN COMPUTER SYSTEM

This application is based on and claims the benefit of priority from Taiwan Patent Application 102143783, filed on Nov. 29, 2013.

BACKGROUND

The present disclosure relates to power consumption control in computer systems, and more particularly, to power consumption control in a rack-style or grouped computer system.

In the situation where, for example, a data center is operating, servers or any other computers are grouped and disposed on a rack, so as to facilitate management and enhance space efficiency. For details of rack-style computer systems, refer to various offerings of International Business Machines Corporation.

To effectuate "system level" power consumption control of a computer system which comprises grouped servers and rack-style computer systems, various solutions are provided by the prior art.

SUMMARY

To effectuate power consumption control of a computer system which comprises grouped servers and rack-style computer systems, the prior art typically discloses providing an additional management unit, such as an additional dedicated server or a controller disposed in a power distribution unit (PDU), and coordinating or allocating appropriate power to each server to thereby prevent the total power consumption from exceeding a threshold, or optimizing power allocation according to the operating condition of each server.

The aforementioned additional management unit not only incurs costs but also adds to complexity of system administration. In view of this, the present disclosure puts forth a technique whereby self-management may be performed by each server in a group of servers. Since each server has a mechanism for controlling its power consumption, i.e., "server level" power consumption control, the present disclosure involves using the server mechanism to effectuate "system level" power consumption control. Furthermore, by dispensing with the additional management unit otherwise disclosed by the prior art to coordinate the servers in a system, the present disclosure puts forth a novel technique to use each server in a group of servers to determine a sequence of power control according to a given rule.

In certain embodiments, the present disclosure relates to a computer system including a first server, a second server, and a power distribution unit (PDU) for supplying power to the first server and the second server, monitoring the power supplied to the first server and the second server so as to obtain a power sum value, and transmitting the power sum value to the first server. In certain embodiments, the first server may determine whether the power sum value exceeds a first predetermined threshold, and the first server performs a power throttling if the determination is affirmative.

In another embodiment, the present disclosure relates to a method of controlling power consumption in a computer system, the computer system comprising a plurality of servers and a power distribution unit (PDU), the PDU supplying power to the plurality of servers and monitoring the power supplied to the plurality of servers so as to obtain a power sum value. In certain embodiments the method may include transmitting, by the PDU, the power sum value to the servers, and determining whether the power sum value of any one of the servers exceeds a first predetermined threshold, and performing a power throttling by the server if the determination is affirmative.

The above summary is not intended to describe each illustrated embodiment or ever implementation of the present disclosure. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings.

Figure 1:
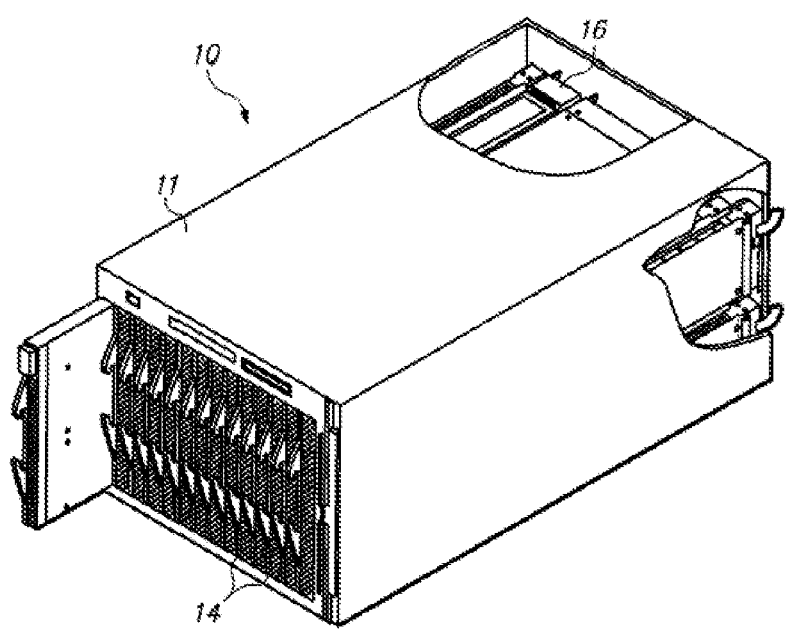
FIG. 1 is a schematic perspective view of a rack-style computer system according to a specific embodiment of the present disclosure.

While embodiments of the present disclosure are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE EMBODIMENTS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings.

As will be appreciated by one skilled in the art, the present disclosure may be embodied as a system/device, a method or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed wherein.

Figure 2:
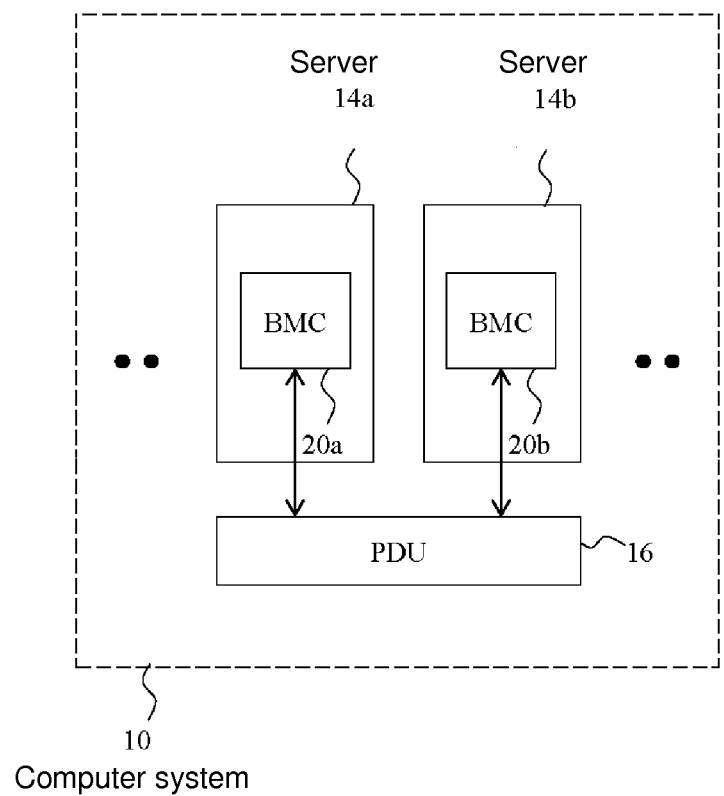
FIG. 2 is a function block diagram of the rack-style computer system of FIG. 1.
Figure 3:
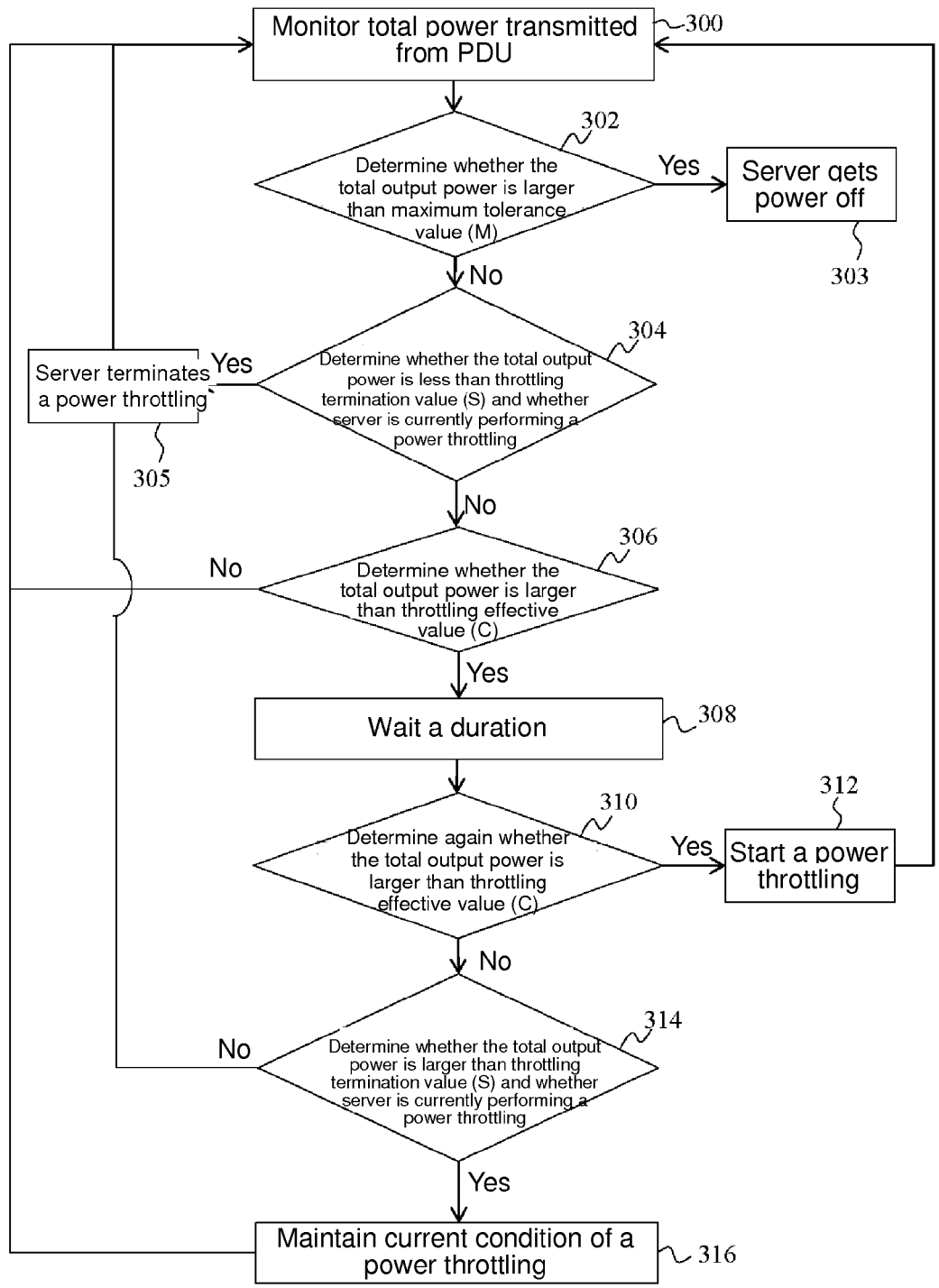
FIG. 3 is a control flow chart according to an embodiment of the present disclosure.

Referring now to FIG. 1 through FIG. 3, systems/devices, methods, and computer program products are illustrated as structural or functional block diagrams or process flowcharts according to various embodiments of the present disclosure. The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 1 shows a schematic perspective view of a computer system 10 according to an embodiment of the present disclosure. As shown in the diagram, the computer system 10 is a rack-style computer system and comprises an enclosure 11, wherein blade servers 14 and a power distribution unit (PDU) 16 are disposed in the enclosure 11. FIG. 1 is illustrative of the computer system 10 of the present disclosure.

FIG. 2 shows a function block diagram of the computer system 10. As shown in the diagram, the computer system 10 comprises servers 14a, 14b and the PDU 16 which supply power to the servers 14a, 14b. In this embodiment, the servers 14a, 14b comprise system management controllers 20a, 20b, respectively. In certain embodiments, the system management controllers 20a, 20b and functions of the servers 14a, 14b may correspond to baseboard management controllers (BMCs).

FIG. 2 illustrates a rack-style computer system 10 including the PDU 16 and at least two servers 14. In general, in the computer system 10, the PDU 16 supplies power to each server.

The PDU 16 is capable of monitoring power, so as to monitor the power supplied by the PDU 16. FIG. 2 illustrates the power supplied to the servers 14a, 14b and the total power. In certain embodiments, the power supplied by the PDU 16 is not constant, but varies with the operation of the servers 14a, 14b. In another aspect, the PDU 16 is capable of Ethernet-enabled communication and thus can communicate, via the Ethernet (not shown), with the servers 14a, 14b and any other devices on the Ethernet. In an embodiment, the PDU 16 further provides a Webpage interface (not shown) whereby users monitor the operation of the PDU 16 by remote connection. For further details of the PDU 16, refer to IBM's PDU+.

FIG. 3 shows a flow chart of power consumption control according to an embodiment of the present disclosure. In this embodiment, power consumption control is effectuated at the computer system level rather than server level. Hence, the joint power consumption of the servers 14a, 14b in the computer system 10 is illustrated with the embodiment of FIG. 2. Before power consumption control is effectuated, three power reference values are defined according to a combination of the servers 14a, 14b, that is, the level of the computer system 10. The three power reference values in descending order are as follows:

(1) maximum tolerance value (M)
(2) throttling effective value (C)
(3) throttling termination value (S)

If the power jointly consumed by the servers 14a, 14b exceeds maximum tolerance value (M), the system may be damaged, and the servers 14a, 14b may be powered off immediately in order to prevent the system from getting damaged. If the power jointly consumed by the servers 14a, 14b exceeds throttling effective value (C) but does not exceed maximum tolerance value (M), at least one of the servers 14a, 14b will perform a power throttling, and the at least one of the servers 14a, 14b will terminate the power throttling as soon as the power jointly consumed by the servers 14a, 14b is less than throttling termination value (S). Further details are described later.

Users may set maximum tolerance value (M), throttling effective value (C), and throttling termination value (S) in the servers 14a, 14b in accordance with operation laws and regulations as well as actual situations. An important point to note is that the laws and regulations in some countries require that power consumption of the rack-style computer system in its entirety shall be placed under control. In the embodiment illustrated with FIG. 2, the computer system 10 comprises the PDU 16 and the servers 14a, 14b receiving power from the PDU 16. In practice, maximum tolerance value (M), throttling effective value (C), and throttling termination value (S) are set according to the quantity of the PDUs and the quantity of the servers supported by each said PDU in the rack-style computer system.

In an embodiment, the users may provide a reference table of maximum tolerance value (M), throttling effective value (C), and throttling termination value (S), such that the servers 14a, 14b can choose the appropriate value as needed. In an embodiment described below, the servers 14a, 14b may adopt the same maximum tolerance value (M), the same throttling effective value (C), and the same throttling termination value (S), but the present disclosure is not limited thereto.

Although a method of controlling power consumption in the computer system 10 according to the present disclosure, as described below, is illustrated with respect to the server 14a, it applies to the server 14b as well. Furthermore, the present disclosure neither requires that both the server 14a and the server 14b have to carry out the following steps simultaneously, nor requires that both the server 14a and the server 14b are capable of carrying out the following steps of the method. In certain embodiments, the following steps of the method are carried out with the BMC 20*a* or the BMC 20*b*. In certain embodiments, the following steps of the method are carried out with an application executed on the server 14*a* or the server 14*b*.

At step 300, after the computer system 10 has booted, the server 14*a* and the PDU 16 may be connected to a network, and total power (i.e., the sum of the powers supplied by the PDU 16 to the servers 14*a*, 14*b* in the embodiment illustrated with FIG. 2) currently output by the PDU 16 may be detected at the PDU 16 at regular intervals, such as 1 ms. The servers, such as the server 14*a* and the server 14*b*, in the computer system 10 may adopt identical or slightly different intervals, wherein the different intervals prevent different servers from performing throttling simultaneously. Furthermore, the server 14*a* can also detect the power supplied by the PDU 16 to the server 14*a*. However, if the server 14*a* has the BMC 20*a*, the BMC 20*a* can detect the power consumed by the server 14*a*, and thus it will be unnecessary for the power to be detected at the PDU 16.

At step 302, the server 14*a* may determine whether the power supplied by the PDU 16 to the servers 14*a*, 14*b* exceeds maximum tolerance value (M). If the determination is affirmative, the process flow of the method may proceed to step 303.

At step 303, the server 14*a* may be powered off immediately, in order to prevent the hardware from being damaged. If the determination (e.g., the determination at step 302) is negative, the process flow of the method may proceed to step 304.

At step 304, the server 14*a* may determine whether the power supplied by the PDU 16 to the servers 14*a*, 14*b* is less than the throttling termination value (S) and whether the server 14*a* is currently performing power throttling. The process flow of the method may proceed to step 305 if the determination is affirmative, and step 306 if the determination is negative.

At step 305, the server 14*a* may terminate a power throttling, and the process flow of the method may return to step 300.

At step 306, the server 14*a* determines whether the power supplied by the PDU 16 to the servers 14*a*, 14*b* is larger than throttling effective value (C). The process flow of the method may return to step 300 if the determination is negative, and step 308 if the determination is affirmative.

At step 308, the server 14*a* may wait a duration (e.g., a time interval).

At step 310, the server 14*a* determines whether the power supplied by the PDU 16 to the servers 14*a*, 14*b* is larger than throttling effective value (C). The process flow of the method may proceed to step 312 if the determination is affirmative, and step 314 if the determination is negative.

At step 312, the server 14*a* may start power throttling, and the process flow of the method may return to step 300. In certain embodiments, in step 312, the power throttling may occur in steps, for example, descending by five levels and throttling only one level (i.e., a fixed range) in each occasion, so as to avoid excessive throttling which might otherwise compromise the operation of the server 14*a*. If the server 14*a* has already performed a power throttling (for example, the first level throttling) before step 312, step 312 will see the server 14*a* throttling the next level (i.e., the second level throttling) through the lowest level.

The aforementioned technique may allow the server 14*a* to perform a power throttling by, for example, adjusting the operation of a processor or a memory. The aforementioned technique, which is disclosed in the prior art, is illustrated rather than restricted by the present disclosure.

At step 314, the server 14*a* may determine whether the power supplied by the PDU 16 to the servers 14*a*, 14*b* is larger than throttling termination value (S) and whether the server 14*a* is currently performing a power throttling. The process flow of the method may proceed to step 316 if the determination is affirmative, and back to step 305 if the determination is negative.

At step 306, the server 14*a* maintains the current condition (i.e., level) of a power throttling, and the process flow of the method goes back to step 300.

Note that in step 308, different servers, such as the server 14*a* and the server 14*b*, in the computer system 10 wait durations of different lengths so as not to perform throttling simultaneously. In certain embodiments, users may define the length of the duration by which each server waits in step 308; for example, the server 14*a* may wait one second, whereas the server 14*b* waits two seconds. Put differently, the more power a server consumes, the shorter the duration the server waits; hence, the more power a server consumes, the earlier the server performs a power throttling.

In certain embodiments, the server 14*a* and the server 14*b* determine dynamically the length of the duration they wait in step 308 according to an available system operation parameter. For example, a server determines the length of the duration it waits according to the power currently consumed by the server (and detected at the BMC or the PDU 16). For example, the greater the power consumption, the shorter the waiting duration. Hence, if the server 14*a* consumers more power than the server 14*b*, step 308 may see the server 14*a* waiting a shorter duration than the server 14*b* and thus performing throttling earlier than the server 14*b*.

In another embodiment, a server adjusts the length of the duration according to the difference between the power currently consumed by the server and the rated maximum consumption power of the server. The smaller the difference is, the closer the power consumed by the server may be to the rated maximum consumption power of the server, and thus the server may perform throttling earlier. In certain embodiments, a server adjusts the length of the duration according to the ratio of the aforementioned difference to the rated maximum consumption power, such that the smaller the ratio of a server is, the earlier the server performs throttling.

In addition to the power currently consumed by servers, the length of the duration the servers wait can also be dynamically determined according to any other parameters available to the BMCs or an operating system, such as temperature, fan rotation speed, and quantity of tasks. The aforesaid technical features fall within the claims of the present disclosure.

The foregoing preferred embodiments are provided to illustrate and disclose the technical features of the present disclosure, and are not intended to be restrictive of the scope of the present disclosure. Hence, all equivalent variations or modifications made to the foregoing embodiments without departing from the spirit embodied in the disclosure of the present disclosure should fall within the scope of the present disclosure as set forth in the appended claims.

What is claimed is:

1. A method of controlling power consumption in a computer system, the computer system comprising a plurality of servers and a power distribution unit (PDU), the PDU supplying power to the plurality of servers and monitoring the power supplied to the plurality of servers so as to obtain a power sum value, the method comprising the steps of:

transmitting, by the PDU, the power sum value to the servers; and determining, by any one of the plurality of servers, whether the power sum value exceeds a first predetermined threshold, and performing a power throttling by said any one of the plurality of servers if the determination is affirmative;

wherein the determining further comprises determining a waiting duration according to the power currently consumed by said any one of the plurality of servers, determining whether the power sum value exceeds the first predetermined threshold at two points in time which are separated by the waiting duration, and performing a power throttling by said any one of the plurality of servers if the power sum value of the plurality of servers exceeds the first predetermined threshold at the two points in time which are separated by the waiting duration.

2. The method of claim 1, wherein the determining a waiting duration further comprises determining a waiting duration according to a difference between the power currently consumed by said any one of the plurality of servers and a maximum consumption power of said any one of the plurality of servers.

3. The method of claim 2, wherein the determining a waiting duration according to a difference between the power currently consumed by said any one of the plurality of servers and a maximum consumption power of said any one of the plurality of servers further comprises determining a waiting duration according to a ratio of the difference between the power currently consumed by said any one of the plurality of servers and the maximum consumption power of said any one of the plurality of servers to the maximum consumption power of said any one of the plurality of servers.

\* \* \* \* \*